(12) United States Patent
Wu et al.

(10) Patent No.: US 7,341,818 B2
(45) Date of Patent: *Mar. 11, 2008

(54) NORBORNENE-TYPE MONOMERS AND POLYMERS CONTAINING PENDENT LACTONE OR SULTONE GROUPS

(75) Inventors: Xiaoming Wu, Strongsville, OH (US); Larry F. Rhodes, Silver Lake, OH (US); Lawrence Seger, Gates Mills, OH (US)

(73) Assignee: Promerus LLC, Brecksville, OH (US)

( * ) Notice: Subject to any disclaimer, the term of this patent is extended or adjusted under 35 U.S.C. 154(b) by 187 days.

This patent is subject to a terminal disclaimer.

(21) Appl. No.: 11/033,010

(22) Filed: Jan. 10, 2005

(65) Prior Publication Data

US 2005/0153240 A1    Jul. 14, 2005

Related U.S. Application Data

(63) Continuation-in-part of application No. 10/757,119, filed on Jan. 14, 2004, now Pat. No. 7,101,654.

(51) Int. Cl.
  *G03F 7/039*  (2006.01)
  *G03F 7/033*  (2006.01)
  *G03F 7/30*   (2006.01)
(52) U.S. Cl. .................. 430/270.1; 430/326; 430/905; 430/910; 526/257; 526/281; 528/40; 549/14; 549/273; 549/295; 549/320; 549/323
(58) Field of Classification Search ............... 549/14, 549/273, 295, 320, 323; 526/257, 281; 528/40; 430/270.1, 326, 905, 910
See application file for complete search history.

(56) References Cited

U.S. PATENT DOCUMENTS

| | | | |
|---|---|---|---|
| 4,857,426 A | 8/1989 | Bott et al. | 430/18 |
| 5,087,677 A | 2/1992 | Brekner et al. | 526/160 |
| 5,324,801 A | 6/1994 | Brekner et al. | 526/160 |
| 5,371,158 A | 12/1994 | Brekner et al. | 526/127 |
| 5,422,409 A | 6/1995 | Brekner et al. | 526/281 |
| 5,468,819 A | 11/1995 | Goodall et al. | 526/171 |
| 5,569,730 A | 10/1996 | Goodall et al. | 526/282 |
| 5,571,881 A | 11/1996 | Goodall et al. | 526/171 |

(Continued)

FOREIGN PATENT DOCUMENTS

| | | |
|---|---|---|
| EP | 0 455 755 A2 | 9/1991 |
| WO | 96/37528 | 11/1996 |

(Continued)

OTHER PUBLICATIONS

Uetani et al.; "Positive ArF resist with 2eAdMA/GBLMA resin system"; SPIE Conference on Advance Resist Technology and Processing XVI, 1999; SPIE vol. 3678; pp. 510-513.

(Continued)

*Primary Examiner*—Richard L. Schilling
(74) *Attorney, Agent, or Firm*—Renner, Otto, Boisselle & Sklar, LLP

(57) ABSTRACT

The disclosed invention relates to novel norborne-type monomers containing pendent lactone or sultone groups. The invention also relates to norborne-type polymers and copolymers containing pendent lactone or sultone groups. These polymers and copolymers are useful in making photoimagable materials. The photoimagable materials are particularly suitable for use in photoresist compositions useful in 193 and 157 nm photolithography.

26 Claims, 3 Drawing Sheets

U.S. PATENT DOCUMENTS

| | | | |
|---|---|---|---|
| 5,602,219 A | 2/1997 | Aulbach et al. | 526/160 |
| 5,605,726 A | 2/1997 | Gibbons et al. | 428/1 |
| 5,637,400 A | 6/1997 | Brekner et al. | 428/137.3 |
| 5,663,308 A | 9/1997 | Gibbons et al. | 534/573 |
| 5,698,645 A | 12/1997 | Weller et al. | 526/160 |
| 5,714,304 A | 2/1998 | Gibbons et al. | 430/270.11 |
| 5,733,991 A | 3/1998 | Rohrmann et al. | 526/160 |
| 5,760,139 A | 6/1998 | Koike et al. | 525/200 |
| 5,783,636 A | 7/1998 | Koike et al. | 525/199 |
| 5,881,201 A | 3/1999 | Khanarian et al. | 385/146 |
| 5,916,971 A | 6/1999 | Koike et al. | 525/197 |
| 6,057,466 A | 5/2000 | Starzewski et al. | 556/19 |
| 6,121,340 A | 9/2000 | Shick et al. | 522/31 |
| 6,136,499 A | 10/2000 | Goodall et al. | 430/270.1 |
| 6,166,125 A | 12/2000 | Sugiyama et al. | 524/462 |
| 6,169,052 B1 | 1/2001 | Brekner et al. | 502/152 |
| 6,183,934 B1 | 2/2001 | Kawamonzen | 430/270.1 |
| 6,197,984 B1 | 3/2001 | Makovetsky et al. | 556/146 |
| 6,214,951 B1 | 4/2001 | Brekner et al. | 526/160 |
| 6,232,417 B1 | 5/2001 | Rhodes et al. | 526/171 |
| 6,265,131 B1 | 7/2001 | Chang et al. | 430/270.1 |
| 6,284,429 B1 | 9/2001 | Kinsho et al. | 430/270.1 |
| 6,294,616 B1 | 9/2001 | Rhodes et al. | 525/332.1 |
| 6,538,087 B2 | 3/2003 | Zhao et al. | 526/280 |
| 7,101,654 B2 * | 9/2006 | Wu et al. | 430/270.1 |
| 2002/0091215 A1 * | 7/2002 | Tachibana et al. | 526/266 |
| 2003/0176583 A1 | 9/2003 | Rhodes et al. | 525/326.2 |

FOREIGN PATENT DOCUMENTS

| | | |
|---|---|---|
| WO | 00/20472 | 4/2000 |
| WO | 00/24726 | 5/2000 |
| WO | 00/34344 | 6/2000 |

OTHER PUBLICATIONS

Nozaki et al.; "New Protective Groups in Alicyclic Methacrylate Polymers for 193-nm Resists"; *Journal of Photopolymer Science and Technology*; vol. 10, No. 4; 1997; pp. 545-550.

Chan et al.; "New Chiral Sultam Auxiliaries: Preparation and Their Application in Asymmetric Diels-Alder Reactions"; Tetrahedron: Asymmetry; vol. 8, No. 15; pp. 2501-2404; 1997.

Brodsky et al.; "157 nm Resist Materials: Progress Report"; *J. Vac. Sci. Technol. B 18*(6); Nov./Dec. 2000; pp. 3396-3401.

Hung et al.; "Resist Materials for 157 nm Microlithography: An Update"; Proceedings of the SPIE, vol. 4345; Conference held in Santa Clara, CA Feb. 2001.

Chiba et al.; "157 nm Resist Materials: A Progress Report"; *Journal of Photopolymer Science and Technology*; vol. 13, No. 4; 2000; pp. 657-664.

Patterson et al.; "Polymers for 157 nm Photoresist Applications: A Progress Report" ; Proc. of SPIE; Vol. 3999, Advances in Resist Technology and Processing XVII, 2000.

Hung et al.; "Synthesis of Alicyclic Polymers for 157 nm Photoresists by $PD^{2+}$Catalyzed Vinyl Addition Polymerization"; California Institute of Technology, Posted Mar. 14, 2003.

* cited by examiner (a)　　　　　　　　　(b)

NORBORNENE-TYPE MONOMERS AND POLYMERS CONTAINING PENDENT LACTONE OR SULTONE GROUPS

This application is a continuation-in-part of U.S. application Ser. No. 10/757,119, filed Jan. 14, 2004, now U.S. Pat. No. 7,101,654 which is incorporated herein by reference in its entirety.

TECHNICAL FIELD

This invention relates to norbornene-type monomers and polymers containing pendent lactone or sultone groups and to the use of the foregoing polymers as photoimagable materials.

BACKGROUND OF THE INVENTION

Integrated circuits (IC's) are paramount in the manufacture of an array of electronic devices. They are fabricated from the sequential formation of alternating and interconnecting bands of conductive, semiconductive and nonconductive layers on an appropriate substrate (e.g., silicon wafer) that are selectively patterned to form circuits and interconnections to produce specific electrical functions. The patterning of IC's is carried out according to various lithography techniques known in the art. Photolithography employing ultraviolet (UV) light and increasingly deep UV light or other radiation is a fundamental and important technology utilized in the production of IC devices. A photosensitive polymer film (photoresist) is applied over the wafer surface and dried. A photomask containing the desired patterning information is then placed over the photoresist film. The photoresist is irradiated through the overlying photomask by one of several types of imaging radiation including UV light, e-beam electrons, x-rays, or ion beam. Upon exposure to radiation, the photoresist undergoes a chemical change with concomitant changes in solubility. After irradiation, the wafer is soaked in a solution that develops (i.e., selectively removes either the exposed or unexposed regions) the patterned images in the photosensitive polymer film. Depending on the type of polymer used, or the polarity of the developing solvent, either the exposed or nonexposed areas of film are removed in the developing process to expose the underlying substrate, after which the patterned exposed or unwanted substrate material is removed or changed by an etching process leaving the desired pattern in a functional layer of the wafer. Etching may be accomplished by plasma etching, sputter etching, or reactive ion etching (RIE). The remaining photoresist material functions as a protective barrier against the etching process. Removal of the remaining photoresist material gives the patterned circuit.

Two types of photoresists are used in the industry, negative and positive photoresists. Negative resists, upon exposure to imaging radiation, polymerize, crosslink, or change solubility characteristics such that the exposed regions are insoluble to the developer. Unexposed areas remain soluble and are washed away. Positive resists function in the opposite way, becoming soluble in the developer solution after exposure to imaging radiation.

Trends in the electronics industry continually require IC's that are faster and consume less power. To meet this specification the IC must be made smaller. Conducting pathways (i.e., lines) must be made thinner and placed closer together. The significant reduction in the size of the transistors and the lines produced yields a concomitant increase in the efficiency of the IC, e.g., greater storage and processing of information on a computer chip. To achieve thinner line widths, higher photoimaging resolution is necessary. Higher resolutions are possible with shorter wave lengths of the exposure source employed to irradiate the photoresist material. However, the prior art photoresists such as the phenol-formaldehyde novolac polymers and the substituted styrenic polymers contain aromatic groups that inherently become increasingly absorptive as the wave length of light falls below about 300 nm, (ACS Symposium Series 537, Polymers for Microelectronics, Resists and Dielectrics, 203rd National Meeting of the American Chemical Society, Apr. 5-10, 1992, p. 2-24; Polymers for Electronic and Photonic Applications, Edited by C. P. Wong, Academic Press, p. 67-118). Shorter wave length sources are typically less bright than traditional sources which necessitate a chemical amplification approach using photoacids. The opacity of these aromatic polymers to short wave length light is a drawback in that the photoacids below the polymer surface are not uniformly exposed to the light source and, consequently, the polymer is not developable. To overcome the transparency deficiencies of these polymers, the aromatic content of photoresist polymers must be reduced. If deep UV transparency is desired (i.e., for 248 nm and particularly 193 nm wave length exposure), the polymer should contain a minimum of aromatic character.

In many instances, the improvement in transparency to short wave length imaging radiation results in the erosion of the resist material during the subsequent dry etching process. Because photoresist materials are generally organic in nature and substrates utilized in the manufacture of IC's are typically inorganic, the photoresist material has an inherently higher etch rate than the substrate material when employing the RIE technique. This necessitates the need for the photoresist material to be much thicker than the underlying substrate. Otherwise, the photoresist material will erode away before the underlying substrate could be fully etched. It follows that lower etch rate resist materials can be employed in thinner layers over the substrate to be etched. Thinner layers of resist material allow for higher resolution which, ultimately, allows for narrower conductive lines and smaller transistors.

With the present invention certain polynorbornenes have been developed for photoresists in 193 and 157 nm photolithography. Advantages of these polynorbornenes include high transparency at the foregoing wavelengths, and high etch resistance. These properties allow photoactive films (such as photoresists) based on these polymers to be patterned at these wavelengths. Hence high-resolution features may be formed on substrates by transferring the patterns from the photoresists layer through etch processing. The present invention also relates to certain norbornene-type monomers useful in making these polynorbornenes.

SUMMARY OF THE INVENTION

This invention relates to novel norborne-type monomers containing pendent lactone or sultone groups. This invention also relates to norborne-type polymers and copolymers containing pendent lactone or sultone groups. These polymers and copolymers are useful in making photoimagable materials. The photoimagable materials are particularly suitable for use in photoresist compositions useful in 193 and 157 nm photolithography.

DETAILED DESCRIPTION OF THE INVENTION

Figure 1:
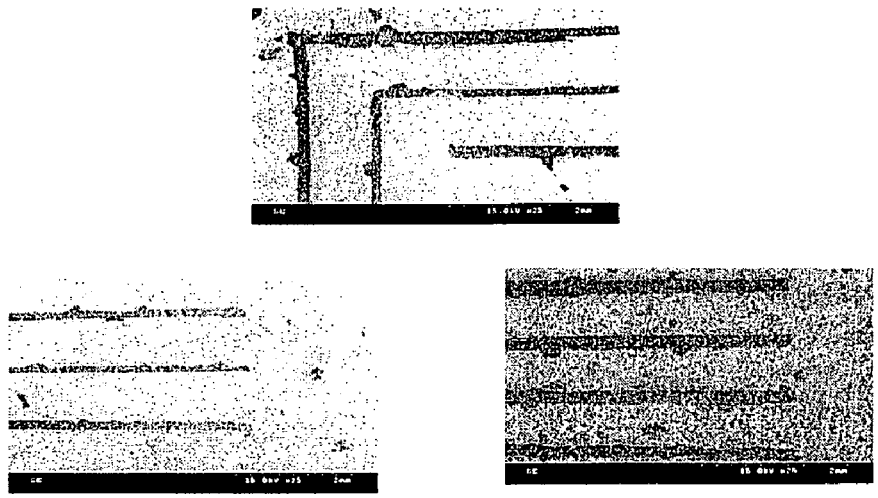
FIG. 1 shows patterns of 100 micron (width) lines obtained from 248 nm lithography in Example 8.

The polymers of the present invention comprise polycyclic repeating units. In one embodiment, these polymers may be prepared by polymerizing certain novel polycyclic monomers. The terms "polycyclic" or "norbornene-type" are used herein to refer to monomers that contain at least one norbornene moiety as shown below or polymers derived from such monomers:

Monomers

In one embodiment, the invention relates to certain novel polycyclic or norbornene-type monomers. These monomers are useful precursors for the inventive polymers. The monomers may be represented by the formula:

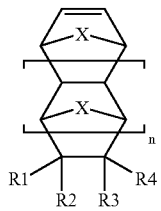

wherein in Formula (I):

X is —$CH_2$—, —$CH_2CH_2$—, O or S;

n is an integer from 0 to 5 inclusive;

each R1 to R4 independently represents hydrogen, a linear or branched ($C_1$ to $C_{20}$) alkyl, or a linear or branched ($C_1$ to $C_{20}$) haloalkyl, subject to the proviso that at least one of R1 to R4 is a group represented by the formula:

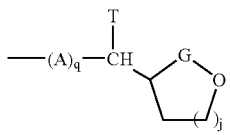

wherein G is —C(O)— or —$SO_2$—; T is H, OH or —OSi($R^{20}$)$_3$ wherein $R^{20}$ is H or ($C_1$ to $C_4$) alkyl; j is 1 to 4 and in one embodiment 1 or 2; q is 0 or 1; and A is a spacer moiety represented by —$(CH_2)_m$—, —$(CH_2)_mO$—, —$(CH_2)_m$O$(CH_2)_m$—, O$(CH_2)_m$—, —$(CH_2)_mNR^9(CH_2)_m$—, —$(C(R^{10})_2)_m(C(R^{10})_2)_mO(C(R^{11})_2)_a$—,

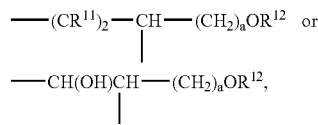

wherein: each $R^9$ independently a ($C_1$ to $C_5$) alkyl; each $R^{10}$ independently is hydrogen, halogen, ($C_1$ to $C_5$) alkyl, or ($C_1$ to $C_5$) haloalkyl; each $R^{11}$ independently is hydrogen or halogen; each $R^{12}$ independently is hydrogen, ($C_1$ to $C_{10}$) alkyl or ($C_1$ to $C_5$) haloalkyl; each a independently is 2 to 6; and each m independently is 0 to 4.

In one embodiment, G is —C(O)—, T is OH or —OSi($CH_3$)$_3$, n is 0, q is 0 and j is 1. In this embodiment, X may be —$CH_2$—, and R1, R2 and R3 may each be hydrogen.

In one embodiment, G is —$SO_2$—, T is H or OH, n is 0, q is 0, and j is 2. In this embodiment, X may be —$CH_2$—, and R1, R2 and R3 may each be hydrogen.

In one embodiment, the monomer may be represented by the formula

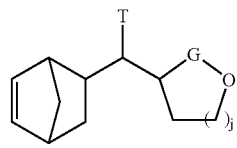

wherein G is —C(O)— or —$SO_2$—, T is —OSi($CH_3$)$_3$, H or OH, and j is 1 or 2.

As used here and throughout the specification and in the appended claims, the term "haloalkyl" means that at least one hydrogen atom on an alkyl group is replaced with a halogen atom selected from fluorine, chlorine, bromine, iodine, and combinations thereof. The degree of halogenation may range from one hydrogen atom on the alkyl group being replaced by a halogen atom (e.g., a monofluoromethyl group) to full halogenation (e.g., perhalogenation) wherein all hydrogen atoms on the alkyl group have been replaced by a halogen atom (e.g., trifluoromethyl or perfluoromethyl). The haloalkyl groups useful in embodiments of the invention may be partially or fully halogenated and may be linear or branched, and in one, embodiment are represented by the formula $C_zX''_{2z+1}$ wherein X" independently is selected from hydrogen and halogen atoms (fluorine, chlorine, bromine, iodine) and z is an integer of 1 to 20, and in one embodiment 1 to 10, and in one embodiment 1 to 5, and at least one of X" is a halogen atom.

The monomers represented by Formula (I) may be made using a Diels-Alder addition reaction in which cyclopentadiene (CPD) or substituted CPD is reacted with a suitable dienophile at elevated temperatures to form the substituted polycyclic or norbornene-type adduct generally shown by the following reaction scheme:

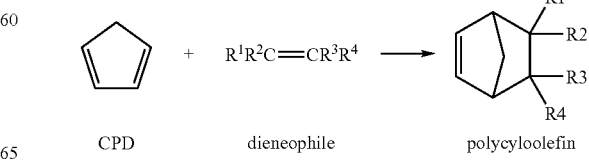

CPD      dieneophile      polycyloolefin

R1 to R4 have the meanings indicated above. CPD may be obtained by the pyrolysis of dicyclopentadiene (DCPD). In cases where the desired functional substituent can not be directly synthesized via the Diels-Alder reaction, a polycycloolefin containing a precursor substituent that can be synthesized via the Diels-Alder process may be reacted with a reactant to give the desired functional group.

Higher polycycloolefin adducts may be prepared by the thermal pyrolysis of dicyclopentadiene (DCPD) in the presence of a suitable dienophile. The reaction proceeds by the initial pyrolysis of DCPD to CPD followed by the Diels-Alder addition of CPD and the dienophile to give the adduct shown below:

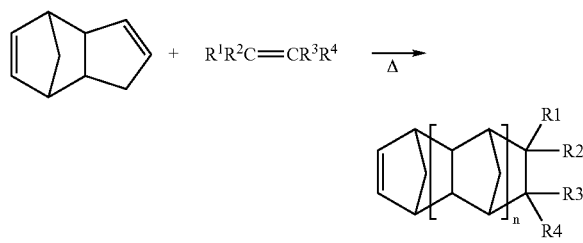

In the above formula, n represents the number of bicyclic units in the monomer, and R1 to R4 are as described above. The number of bicyclic units (n) in the monomer can be increased by allowing the Diels-Alder adduct to further react with additional CPD units.

In one embodiment, the pendent lactone or sultone moieties may be prepared as shown schematically below:

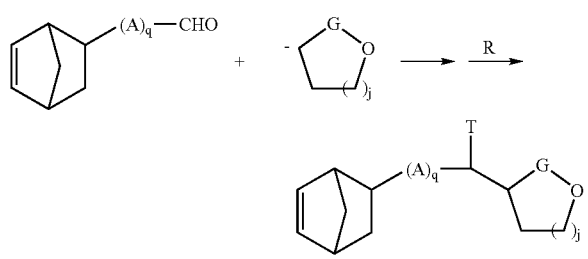

When T is —OH, the reagent R is H$^+$. When T is —OSi(R$^{20}$)$_3$, the reagent R is ClSi(R$^{20}$)$_3$. In the above formula, A and q are as defined above, j is 1 or 2, and G is —C(O)— or —SO$_2$—. Alternatively, a Diels-Alder synthesis route wherein CPD is reacted with an alkenyl lactone or sultone may be used.

Alkenyl lactones and sultones may be synthesized by reacting an ionized lactone or an ionized sultone with an alkenyl bromide (e.g., allylbromide) to yield the desired alkenyl lactone or sultone.

Polymers

The polycyclic polymers of the present invention comprises polycyclic repeating units that are substituted with certain pendent lactone or sultone groups. In one embodiment, the polycyclic polymers comprise one or more repeating units represented by Formula (I-a) (described below). In one embodiment of the invention, the polycyclic polymer comprises one or more repeating units represented from Formula (I-a) in combination with one or more repeating units represented by Formula (II-a).

The repeating unit (I-a) may be represented by the formula:

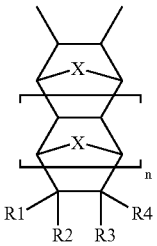

wherein in Formula (I-a): X, n, R1, R2, R3 and R4 are defined above. The repeating unit (I-a) may be derived from a monomer represented by the above indicated Formula (I).

In one embodiment, the repeating unit represented by Formula (I-a) may have the formula

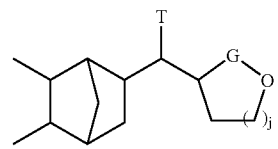

wherein G, T and j are defined above.

The repeating unit (II-a) may be represented by the formula:

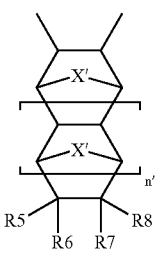

wherein in Formula (II-a):
X' is —CH$_2$—, —CH$_2$CH$_2$—, O or S;
n' is an integer from 0 to 5 inclusive; and
each R5 to R8 independently is selected from: hydrogen; linear or branched (C$_1$ to C$_{20}$) alkyl; linear or branched (C$_1$ to C$_{20}$) haloalkyl; substituted or unsubstituted (C$_4$-C$_{12}$) cycloalkyl; substituted or unsubstituted (C$_1$ to C$_{10}$) hydroxyalkyl; —(CH$_2$)$_b$C(CF$_3$)$_2$OR$^{13}$; —(CH$_2$)$_b$C(O)OR$^{14}$; —(CH$_2$)$_b$OR$^{14}$; —(CH$_2$)$_b$OC(O)R$^{14}$; —(CH$_2$)$_b$C(O)R$^{14}$; —(CH$_2$)$_b$OC(O)OR$^{14}$; —(CH$_2$)$_b$C(O)OR$^{15}$; —(CH$_2$)$_b$Si(R$^{16}$)$_3$; —(CH$_2$)$_b$Si(OR$^{16}$)$_3$; —(CH$_2$)$_b$NR$^{17}$SO$_2$R$^{18}$; or —(CH2)$_b$SO$_2$NR$^{17}$R$^{18}$;

wherein: b is 0 to 4; each R$^{13}$ independently is selected from hydrogen, linear or branched (C$_1$-C$_{10}$) alkyl, or linear or branched (C$_1$-C$_{10}$) haloalkyl; each R$^{14}$ is selected from hydrogen, linear or branched (C$_1$ to C$_{10}$) alkyl, or substituted or unsubstituted (C$_4$-C$_8$) cycloalkyl; R$^{15}$ is an acid labile group; each R$^{16}$ independently is selected from hydrogen and (C$_1$ to C$_5$) alkyl; each R$^{17}$ independently is selected from hydrogen, linear or branched (C$_1$-C$_5$) haloalkyl, linear or branched tri(C$_1$-C$_{10}$) alkylsilyl, —C(O)CF$_3$, —C(O)OR$^{19}$, or —OC(O)OR$^{19}$; each R$^{18}$ independently is selected from hydrogen, linear or branched (C$_1$-C$_{10}$) alkyl, linear or branched (C$_1$-C$_5$) haloalkyl, —OR$^{13}$, —C(O)R$^{13}$, substituted or unsubstituted (C$_3$-C$_8$) cycloalkyl, substituted or unsubstituted cyclic esters containing 2 to 8 carbon atoms, substituted or unsubstituted cyclic ketones containing 4 to 8 carbon atoms, substituted or unsubstituted cyclic ethers or cyclic diethers containing 4 to 8 carbon atoms; each R$^{19}$ independently is selected from linear or branched (C$_1$-C$_{10}$) alkyl, or linear or branched (C$_1$-C$_{10}$) haloalkyl; R5 and R6 and/or R7 and R8 independently taken together can form a (C$_1$-C$_5$) alkylidenyl group or a spiral anhydride group; R6 and R7 taken together with the two ring carbon atoms to which they are attached can form a cyclic (C$_3$ to C$_6$) anhydride group, a cyclic (C$_3$ to C$_6$) sulfonamide group, or a cyclic (C$_3$ to C$_6$) sultone group.

The term "substituted" as used here and throughout the specification and in the appended claims means that the substituent is selected from a linear or branched (C$_1$-C$_{15}$) alkyl, (C$_1$-C$_5$) haloalkyl, (C$_4$-C$_8$) cycloalkyl, halogen, or a combination of two or more thereof. The degree of substitution may range from monosubstitution to multisubstitution.

In one embodiment, X' is —CH$_2$—, n' is 0, each of R5, R6 and R7 is H, and R8 is —(CH$_2$)$_b$C(O)OR$^{14}$, wherein b is 0 and R$^{14}$ is t-butyl.

In one embodiment, X' is —CH$_2$—, n' is 0, each of R5, R6 and R7 is H, and R8 is —(CH$_2$)$_b$C(O)OR$^{14}$, wherein b is 0 and R$^{14}$ is 1-methyl cyclopentyl.

In one embodiment, X' is —CH$_2$—, n' is 0, each of R5, R6 and R7 is H, and R8 is —(CH$_2$)$_b$C(CF$_3$)$_2$OR$^{13}$ wherein b is 1 and R$^{13}$ is hydrogen.

As used in the definition of R$^{15}$ in Formula (II-a) an "acid labile" group is defined herein to mean a blocking or protecting moiety capable of being cleaved from a carboxy group in the presence of an acid. Upon cleavage of the protecting moiety, a polar functional group is formed which can confer different solubility characteristics to the polymer. In one embodiment, cation photoinitiators or photoacid generating compounds (PAG) selected from onium salt compounds that contain phosphonium, sulfonium and iodonium cations may be used to induce the cleavage the acid labile group.

Exposure of the PAG to a radiation source generates a strong acid which catalyzes the cleavage of the acid labile moiety. Representative acid labile groups under R$^{15}$ include —C(CH$_3$)$_3$, —Si(CH$_3$)$_3$, —CH(R$^{21}$)OCH$_2$CH$_3$, —CH(R$^{21}$)OC(CH$_3$)$_3$, dicyclopropylmethyl, dimethylcyclopropylmethyl, or one or more of the following cyclic groups:

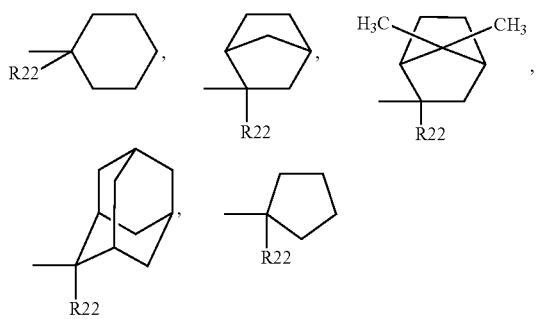

wherein: R$^{21}$ is H or (C$_1$ to C$_4$) alkyl; and R$^{22}$ is hydrogen or a linear or branched (C$_1$-C$_5$) alkyl group. The alkyl substituents include but are not limited to methyl, ethyl, propyl, i-propyl, butyl, i-butyl, t-butyl, pentyl, t-pentyl and neopentyl. In the above structures, the single bond line projecting from the illustrated cyclic groups represents the covalent bond between the acid labile group and the oxygen atom of the carboxyl group. It is also to be recognized that this covalent bond and the R$^{22}$ substituent may be situated on any ring carbon atom. In one embodiment, the bond to the carboxyl group and the R$^{19}$ substituent are situated on the same ring carbon atom forming a tertiary ring carbon as illustrated in several of the cyclic moieties set forth above.

The inventive polymers may be prepared by: (a) polymerizing a monomer composition comprising a compound represented by Formula (I) alone or in combination with a compound represented by Formula (II); (b) polymerizing a monomer composition encompassing one or more functional groups containing polycycloolefin monomer(s) to obtain a precursor polymer containing pendant groups that are subsequently post-functionalized to form a polymer containing repeating units represented by Formula (I-a); (c) polymerizing a polycycloolefin monomer composition encompassing the polycycloolefin monomer(s) set forth in monomer compositions (a) and (b) to obtain a precursor polymer that is subsequently post-functionalized to contain additional repeating units represented by Formula (II-a); or (d) polymerizing a monomer composition that encompasses the polycycloolefin monomer composition set forth in (a), (b) or (c) in combination with a monomer selected from (meth)acrylic acid, linear or branched (C$_1$ to C$_5$) alkyl esters of acrylic acid, maleic anhydride, sulfur dioxide, or a mixture of two or more thereof.

The repeating unit (II-a) may be derived from a monomer represented by the following Formula (II):

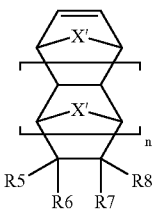

wherein in Formula (II): X', n' and R5, R6, R7 and R8 are defined above.

In one embodiment, the polymerizable polycycloolefin monomer composition set forth in (c) encompasses one or more monomers represented by Formula (I) in combination with one or more monomers represented by Formula (II).

In one embodiment, the polymerizable monomer composition encompasses one or more polycycloolefin monomers selected from a monomer represented by (i) Formula (I) or (ii) Formula (I) in combination with Formula (II); in combination with a monomer selected from acrylic acid, methacrylic acid, maleic acid, itaconic acid, citraconic anhydride, itaconic anhydride, maleic anhydride, or linear and branched (C$_1$ to C$_5$) alkyl esters of acrylic acid, sulfur dioxide, or a mixture of two thereof.

The polycyclic monomer compositions set forth under (a), (b), (c), and (d) above may be prepared by vinyl-addition polymerization in the presence of a single or multicomponent Group VIII transition metal catalyst or a free radical catalyst initiator. In one embodiment of the invention the Group VIII transition metal catalysts employ nickel and palladium compounds. Such catalysts are disclosed in U.S.

Pat. Nos. 6,136,499; 6,303,724; and 6,455,650, the disclosures of which are hereby incorporated by reference. Free radical polymerization techniques are set forth in the *Encyclopedia of Polymer Science*, John Wiley & Sons, 13, 708 (1988).

Generally, in a free radical polymerization process, the monomers are polymerized in a solvent at an elevated temperature (about 50° C. to about 150° C.) in the presence of a free radical initiator. Suitable initiators include but are not limited to azo compounds and peroxides. Examples of free radical initiators are azobisisobutyronitrile (AIBN), benzoyl peroxide, lauryl peroxide, azobisisocapronitrile, azobisisovaleronitrile and t-butylhydroperoxide.

In one embodiment of the invention the free radical catalyst initiators are particularly useful when polymerizing the polycycloolefin monomers set forth under Formula (I) or (IA) alone or in combination with Formula (II) in combination with a monomer selected from acrylic acid, methacrylic acid, maleic acid, itaconic acid, citraconic anhydride, itaconic anhydride, maleic anhydride, and linear or branched ($C_1$ to $C_5$) alkyl esters of acrylic acid, sulfur dioxide, or a mixture of two or more thereof.

It will be recognized that when it is desired to incorporate latent crosslinking moieties into the polymer backbone via free radical polymerization, care should be taken not select monomers that contain pendant free radically polymerizable carbon-carbon unsaturation, as the polymer will crosslink during the free radical polymerization reaction.

Advantageously, polymers in accordance with the present invention are tailorable in that a myriad of functional groups (in addition to combinations of different ion conducting groups) can be readily incorporated into the polymer backbone. For example, if a backbone with more hydrophilic character is desired, monomers that contain hydrophilic groups (e.g., carboxylic acids, diacids, and protected acids) are easily polymerized into the polymer.

Nickel containing catalysts useful for making the polymers utilized in this invention may be represented by the formula:

$$E_p Ni(C_6F_5)_2$$

wherein p is 1 or 2 and E represents a neutral 2 electron donor ligand. When p is 1, E preferably is a pi-arene ligand such as toluene, benzene, and mesitylene. When p is 2, E is preferably selected from diethyl ether, tetrahydrofuran (THF), ethyl acetate (EtOAc) and dioxane. The ratio of monomer to catalyst in the reaction medium can range from about 5000:1 to about 50:1 in some embodiments of the invention, and in other embodiments at a ratio of about 2000:1 to about 100:1. The reaction may be run in a suitable solvent at a temperature range from about 0° C. to about 70° C. In some embodiments, the temperature can range from about 10° C. to about 50° C., and in other embodiments from about 20° C. to about 40° C. Exemplary catalysts of the above formula include (toluene)bis(perfluorophenyl) nickel, (mesitylene)bis(perfluorophenyl) nickel, (benzene)bis(perfluorophenyl) nickel, bis(tetrahydrofuran)bis(perfluorophenyl) nickel, bis(ethyl acetate)bis(perfluorophenyl) nickel and bis(dioxane)bis(perfluorophenyl) nickel.

Palladium containing catalysts useful for making the polymers utilized in this invention can be prepared as a preformed single component catalyst or prepared in situ by admixing a palladium containing procatalyst with an activator in the presence of the desired monomer(s) to be polymerized.

The preformed catalyst can be prepared by admixing the catalyst precursors such as a procatalyst and activator in an appropriate solvent, allowing the reaction to proceed under appropriate temperature conditions, and isolating the reaction product a preformed catalyst product. By procatalyst is meant a palladium containing compound that is converted to an active catalyst by a reaction with a cocatalyst or activator compound. The description and synthesis of representative procatalysts and activator compounds are set forth in U.S. Pat. No. 6,455,650, supra. Palladium procatalysts suitable for the polymerization of the monomers of the invention are represented by the formula:

$$(Allyl)Pd(P(R^{21})_3)(L')$$

wherein $R^{21}$ is selected from isopropyl and cyclohexyl; and L' is selected from trifluoroacetate, and trifluoromethanesulfonate (triflate). Representative procatalyst compounds in accordance with such formula are (allyl)palladium(tricyclohexylphosphine)triflate, (allyl)palladium(tri-isopropylphosphine)triflate, (allyl)palladium(tri-cyclohexylphosphine)trifluoroacetate, and (allyl)palladium(tri-isopropylphosphine) trifluoroacetate.

Representative activator compounds may be selected from lithium tetrakis(pentafluorophenyl) borate (LiFABA) and N,N-dimethylaniliniumtetrakis-(pentafluorophenyl) borate (DANFABA).

In one embodiment of the invention, a palladium compound, $Pd(OC(O)CH_3)$, a phosphine compound, and the activators, LiFABA or DANFABA, referred to above can be mixed in situ with the desired monomer(s) to be polymerized. Representative phosphine compounds are phosphines such as tricyclohexylphosphine and triisopropylphosphine.

In one embodiment of the invention, the molar ratio of palladium procatalyst (based on the palladium metal) to activator is 1 to 2. In another embodiment, the ratio is 1 to 4, and in another embodiment the ratio is 1 to 1. It should be noted that the order of addition of the various catalyst components mentioned above to the reaction medium is not important.

The palladium catalysts in accordance with the present invention may exhibit a high activity at monomer to procatalyst molar ratios (i.e., monomer to palladium metal) of over 100,000:1. In some embodiments of the invention, monomer to procatalyst ratios can range from about 100,500:1 to about 1,000,000:1. In other embodiments, from about 110,000:1 to about 500,000:1, and in still other embodiments from about 120,000:1 to about 250,000:1. While these catalysts have been found to be active at monomer to catalyst metal molar ratios of over 100,000:1, it should be recognized that it is within the scope of this invention to utilize monomer to catalyst metal molar ratios of less than 100,000:1. Depending on the activity of a particular catalyst, the reactivity of a certain monomer, the desired molecular weight, or desired polymer backbone tacticity, higher concentrations of catalyst to monomer loading are well within the scope of the present invention (i.e., monomer to catalyst loadings of 50:1 to 99,999:1).

Suitable polymerization solvents for the free radical and vinyl addition polymerization reactions include hydrocarbon and aromatic solvents. Exemplary hydrocarbon solvents include but are not limited to alkanes and cycloalkanes such as pentane, hexane, heptane and cyclohexane. Exemplary aromatic solvents include but are not limited to benzene, toluene, xylene and mesitylene. Other organic solvents such as diethyl ether, tetrahydrofuran, acetates (e.g., ethyl acetate), esters, lactones, ketones and amides are also useful.

Mixtures of one or more of the foregoing solvents can be utilized as a polymerization solvent.

When utilizing the vinyl-addition nickel and palladium catalysts disclosed above, the molecular weight of the polymer can be controlled by employing a chain transfer agent disclosed in U.S. Pat. No. 6,136,499 the disclosure of which is incorporated herein by reference. In one embodiment of the invention, α-olefins, (e.g., ethylene, propylene, 1-hexene, 1-decene, 4-methyl-1-pentene) and cyclohexene are suitable as molecular weight control agents.

In one embodiment of the invention, the polymer suitable for use in the inventive photoresists comprises from about 95 to about 5 mole % (based on the total mole % of the repeating units contained in the polymer backbone) of at least one polycyclic repeating unit defined under Formula (I-a) and from about 5 to about 95 mole % of at least one polycyclic repeating unit defined under Formula (II-a). In one embodiment, the polymer comprises from about 80 to about 20 mole % of at least one polycyclic repeating unit defined under Formula (I-a) and from about 20 to about 80 mole % of at least one polycyclic repeating unit defined under Formula (II-a). In one embodiment, the polymer comprises from about 70 to about 30 mole % of at least one polycyclic repeating unit defined under Formula (I-a) and from about 30 to about 70 mole % of at least one polycyclic repeating unit defined under Formula (II-a). In one embodiment, the polymer comprises from about 60 to about 40 mole % of at least one polycyclic repeating unit defined under Formula (I-a) and from about 40 to about 60 mole % of at least one polycyclic repeating unit defined under Formula (II-a). In one embodiment, the polymer comprises from about 20 to about 60 mole % of at least one polycyclic repeating unit defined under Formula (I-a) and from about 40 to about 80 mole % of at least one polycyclic repeating unit defined under Formula (II-a).

In one embodiment, the polymers have a weight average molecular weight of from about 2,000 to about 50,000, and in one embodiment from about 3,000 to about 30,000, and in one embodiment from about 4,000 to about 15,000. Molecular weights of the polymers obtained may be measured by use of gel permeation chromatograph (GPC) using polynorbornene standards (A modification of ASTM D3536-91). Instrument: Alcot 708 Autosampler; Waters 515 Pump; Waters 410 Refractive Index Detector. Columns: Phenomenex Phenogel Linear Column (2) and a Phenogel $10^6$ Å Column (all columns are 10 micron packed capillary columns). Samples may be run in monochlorobenzene. The absolute molecular weight of the polynorbornene standards may be generated utilizing a Chromatics CMX 100 low angle laser light scattering instrument.

An advantage of the present invention relates to the fact that the inventive polynorbornenes are characterized by high transparencies at 193 and 157 nm wavelengths. These polymers are also characterized by high etch resistance. These properties allow for the use of these polymers in photoactive films such as photoresists in 193 and 157 nm photolithography.

A 193 nm positive tone photoresist may be patterned in a two-step procedure. First the photoresist film is exposed to 193 nm light through a photomask and imaged. Then the optically imaged photoresist is developed with alkaline aqueous solution, typically a 0.26 N tetramethylammonium hydroxide (TMAH) aqueous solution. During the development, polymer in the exposed area becomes soluble and is removed by developer while polymer in the shielded area remains insoluble. Hence the polymer stands as a fine pattern left on the substrate. While not wishing to be bound by theory, it is believed that the mechanism behind photo induced polymer dissolution switching relates to the easy cleavage of acid labile protection of carboxylic acid of polymer in the presence of a photo generated acid. The deprotected carboxylic acid group of the polymer is then responsible for the polymer dissolution in the developer. A large development contrast of photoresist is important in order to achieve high-resolution patterning.

Pendent lactone or sultone groups are introduced into photoresist polymers to improve the development contrast. As the exposed photoresist is treated with alkaline developer, the developer penetrates into the polymer matrix and quickly interacts with the deprotected carboxylic group developer via neutralization. The deprotected carboxylic group is solvated by water in the developer. This creates a large free volume in the polymer matrix allowing faster penetration of developer in the area. The basic developer soaked in the matrix forces the lactone or sultone to undergo hydrolysis. This process may be further quickened by the adjacent hydrophilic —OH group. The lactone or sultone unit opens the ring and generates a new carboxylic group and a hydrophilic hydroxy group. These two groups significantly increase the polymer hydrophilicity and accelerate the polymer dissolution in the developer. In the area of non-exposure the developer has much less effect on the polymer since no deprotected carboxylic groups are present and the polymer therefore does not develop in TMAH. In this way the development contrast is enhanced. In one embodiment, the development of the inventive polymer in aqueous TMAH may be shown schematically as follows:

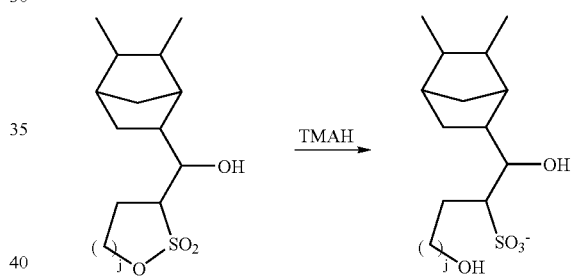

The ionic polymer is very soluble in the aqueous developer.

Photoresist Compositions and Photoimagable Process

The photoresist compositions of the present invention comprise one or more of the foregoing polymers, a solvent, and an photosensitive acid generator (photoinitiator). Optionally, a dissolution inhibitor can be added in an amount of up to about 20 weight % of the composition. A dissolution inhibitor that may be used is t-butyl cholate.

Upon exposure to radiation, the radiation sensitive acid generator generates a strong acid. Suitable photoinitiators include triflates (e.g., triphenylsulfonium triflate), pyrogallol (e.g., trimesylate of pyrogallol); onium salts such as triarylsulfonium and diaryliodium hexafluoroantimonates, hexafluoroarsenates, trifluoromethanesulfonates; esters of hydroxyimides, α,α'-bis-sulfonyl-diazomethanes, sulfonate esters of nitro-substituted benzyl alcohols and napthoquinone-4-diazides. Other suitable photoacid initiators are disclosed in Reichmanis et al., Chem. Mater. 3, 395, (1991). Compositions containing triarylsulfonium or diaryliodonium salts may be used. Unsubstituted and symmetrically or unsymmetrically substituted diaryliodium or triarylsulfonium salts may be used. The photoacid initiator component may comprise about 1 to 100 w/w % to polymer, and in one embodiment 5 to 50 w/w %.

The photoresist compositions of the present invention optionally contain a sensitizer capable of sensitizing the photoacid initiator to longer wave lengths ranging from mid UV to visible light. Depending on the intended application, such sensitizers may include polycyclic aromatics such as pyrene and perlene. The sensitization of photoacid initiators is well-known and is described in U.S. Pat. Nos. 4,250,053; 4,371,605; and 4,491,628 which are all incorporated herein by reference. The invention is not limited to a specific class of sensitizer or photoacid initiator.

The present invention also relates to a process for generating an image on a substrate comprising the steps of: (a) coating a substrate with a film comprising the photoresist composition of the present invention; (b) imagewise exposing the film to radiation; and (c) developing the image.

The first step involves coating the substrate with a film comprising a photoresist composition containing the inventive polymer dissolved in a suitable solvent. Suitable substrates comprise silicon, ceramics, polymer or the like. Suitable solvents include propylene glycol methyl ether acetate (PGMEA), cyclohexanone, butyrolactate, ethyl lactate, and the like. The film can be coated on the substrate using art known techniques such as spin or spray coating, or doctor blading. Before the film has been exposed to radiation, the film may be heated to an elevated temperature of about 90° C. to 150° C. for about 1 min. In the second step of the process, the film is imagewise exposed to radiation such as electron beam or electromagnetic, and in one embodiment electromagnetic radiation such as ultraviolet or x-ray, for example, ultraviolet radiation at a wave length of about 157 or about 193 nm. Suitable radiation sources include mercury, mercury/xenon, and xenon lamps, x-ray or e-beam. The radiation is absorbed by the radiation-sensitive acid generator to produce free acid in the exposed area. The free acid catalyzes the cleavage of the acid labile pendant group of the copolymer which converts the copolymer from dissolution inhibitor to dissolution enhancer thereby increasing the solubility of the exposed resist composition in an aqueous base. The exposed resist composition is readily soluble in aqueous base. After the film has been exposed to radiation, the film may be heated to an elevated temperature of about 90° C. to 150° C. for about 1 minute.

The third step involves development of the positive tone image with a suitable solvent. Suitable solvents include aqueous base, for example, an aqueous base without metal ions, such as tetramethyl ammonium hydroxide or choline. The composition of the present invention provides positive images with high contrast and straight walls. The dissolution property of the composition of the present invention can be varied by simply varying the composition of the copolymer.

The present invention also relates to an integrated circuit assembly such as an integrated circuit chip, multichip module, or circuit board made by the process of the present invention. The integrated circuit assembly comprises a circuit formed on a substrate by the steps of: (a) coating a substrate with a film comprising the positive tone resist composition of the present invention; (b) imagewise exposing the film to radiation; (c) developing the image to expose the substrate; and (d) forming the circuit in the developed film on the substrate by art known techniques.

After the substrate has been exposed, circuit patterns can be formed in the exposed areas by coating the substrate with a conductive material such as conductive metals by art known techniques such as evaporation, sputtering, plating, chemical vapor deposition, or laser induced deposition. The surface of the film can be milled to remove any excess conductive material. Dielectric materials may also be deposited by similar means during the process of making circuits. Inorganic ions such as boron, phosphorous, or arsenic can be implanted in the substrate in the process for making p or n doped circuit transistors. Other techniques for forming circuits are well known to those skilled in the art.

As discussed above, photoresists are used to create and replicate a pattern from a photomask to a substrate. The efficacy of this transfer is determined by the wave length of the imaging radiation, the sensitivity of the photoresist and the ability of the photoresist to withstand the etch conditions which pattern the substrate in the exposed regions. Photoresists are most often used in a consumable fashion, where the photoresist is etched in the non-exposed regions (for a positive tone photoresist) and the substrate is etched in the exposed regions. Because the photoresist is organic and the substrate is typically inorganic, the photoresist has an inherently higher etch rate in the reactive ion etch (RIE) process, which necessitates that the photoresist needs to be thicker than the substrate material. The lower the etch rate of the photoresist matter, the thinner the photoresist layer has to be. Consequently, higher resolution can be obtained. Therefore, the lower the RIE rate of the photoresist, the more attractive it is from a process point of view. The etch rate is primarily determined by the polymer backbone, as shown below for the chlorine plasma etch process which is a RE technique typically employed in semiconductor processing.

The following examples are detailed descriptions of methods of preparation and use of certain compositions of the present invention. The detailed preparations fall within the scope of, and serve to exemplify, the more generally described methods of preparation set forth above. The examples are presented for illustrative purposes only, and are not intended as a restriction on the scope of the invention. As used in the examples and throughout the specification the ratio of monomer to catalyst is based on a mole to mole basis.

EXAMPLE 1

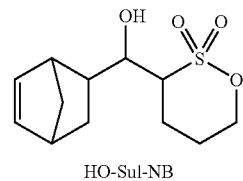

HO-Sul-NB

Synthesis of hydroxyl containing sultone norbornene monomer(HO-5 ul-NB): In a 3-neck 250 mL round bottom flask equipped with a mechanical stirrer and a thermometer, 1,4-butane sultone (27.2g, 0.20 mol) was dissolved in anhydrous tetrahydrofuran, THF (150 mL). To the solution at −70 C, n-Butyl Lithium 10M in hexane (21.0 mL, 0.21 mol) was added drop wise, followed by the slow addition of 5-10 norbornene-2-carboxaldehyde (24.4 g, 0.20 mol) by syringe. The reaction mixture was stirred overnight allowing the temperature to rise to ambient. It was worked up by pouring the reaction mixture into water. The organic extracted into an ethyl acetate solution was washed with water then dried over the $MgSO_4$. After removal of solvents by rota-evaporation, the crude product was purified by crystallization in ethyl acetate to give 21 g, 40.6% yield. NMR showed the endo/exo isomers ratio is 89/11. For one major endo isomer $^1$H NMR (500 MHz in $CDCl_3$): 6.20 (dd, 1H), 6.04 (dd, 1H), 4.47 (m, 2H), 3.73 (m, 1H), 3.08 (m, 1H), 3.04 (m, 1H), 2.84 (m, 1H), 2.2-2.35 (m, 3H), 1.97 (m, 2H), 1.74 (m, 1H), 1.46 (m, 1H), 1.24 (m, 1H), 0.5 (d, 1H); $^{13}$C NMR (125 MHz, in $CDCl_3$): 138.06, 132.63, 74.21, 70.86, 62.32, 49.22, 44.15, 42.46, 41.51, 28.87, 24.40, 21.94. FI-MS m/e: 258.

EXAMPLE 2

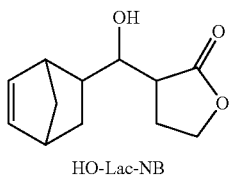

HO-Lac-NB

Synthesis of hydroxyl containing lactone norbornene monomer (HO-Lac-NB): In a 100 mL, 3-neck round bottom flask equipped with a magnetic stirrer and a thermometer, γ-butyrolactone (5.0 g, 57.5 mmol) in 50 mL of anhydrous THF at −70 C was treated with lithium diisopropylamide, LDA. LDA (2M in THF) (29 mL, 58 mmol) was syringed into the agitating lactone solution cautiously to maintain the reaction temperature <−65 C. Then the reaction mixture was stirred at the −70 C for one hour before slowly adding with 5-norbornene-2-carboxaldehyde (7.02 g, 57.5 mmol). After stirring for another 3 h, the reaction mixture was poured into 100 mL of 2N HCl solution. The product was extracted with ethyl ether and washed with DI water. The product crystallized from an ethyl ether solution at −15 C. The pure product as white flakes gave a yield of 3.5 g (25.0%). The product was characterized by NMR and mass spectroscopy. The endo/exo isomers ratio is 94/6 based on the NMR analysis. NMR of a major endo isomer $^1$H (500 MHz in CDCl$_3$): 6.16 (dd, 1H), 6.04 (dd, 1H), 4.38 (m, 1H), 4.19 (m, 1H), 3.12 (s, 1H), 3.08 (m, 1H), 2.83 (m, 1H), 2.60-2.61 (2Hs), 2.31 (m, 1H), 2.22 (m, 1H), 1.87 (s, 1H), 1.44 (d, 1H), 1.26 (d, 1H), 0.56 (dd, 1H); $^{13}$C (125 MHz, in CDCl$_3$) 178.68, 137.67, 132.50, 75.94, 67.22, 48.99 44.32, 44.30, 43.76, 42.65, 30.02, 27.20. FI-MS m/e 208.

EXAMPLE 3

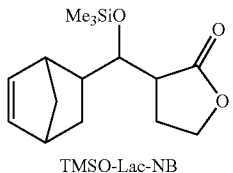

TMSO-Lac-NB

Figure 3:
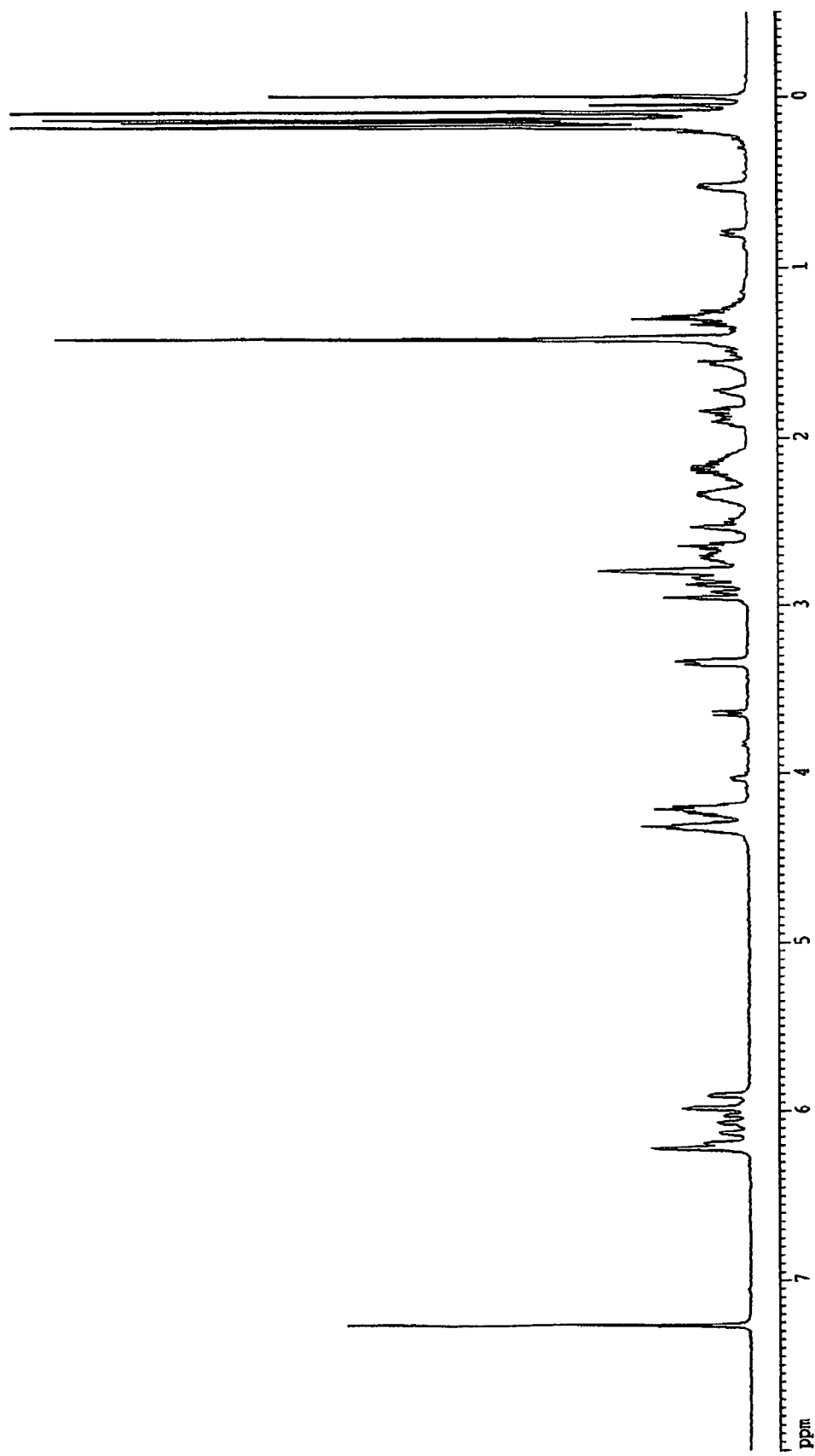
FIG. 3 is a characterization of the product of Example 3 using $^1$H NMR (500 MHz in $CDCl_3$).
Figure 4:
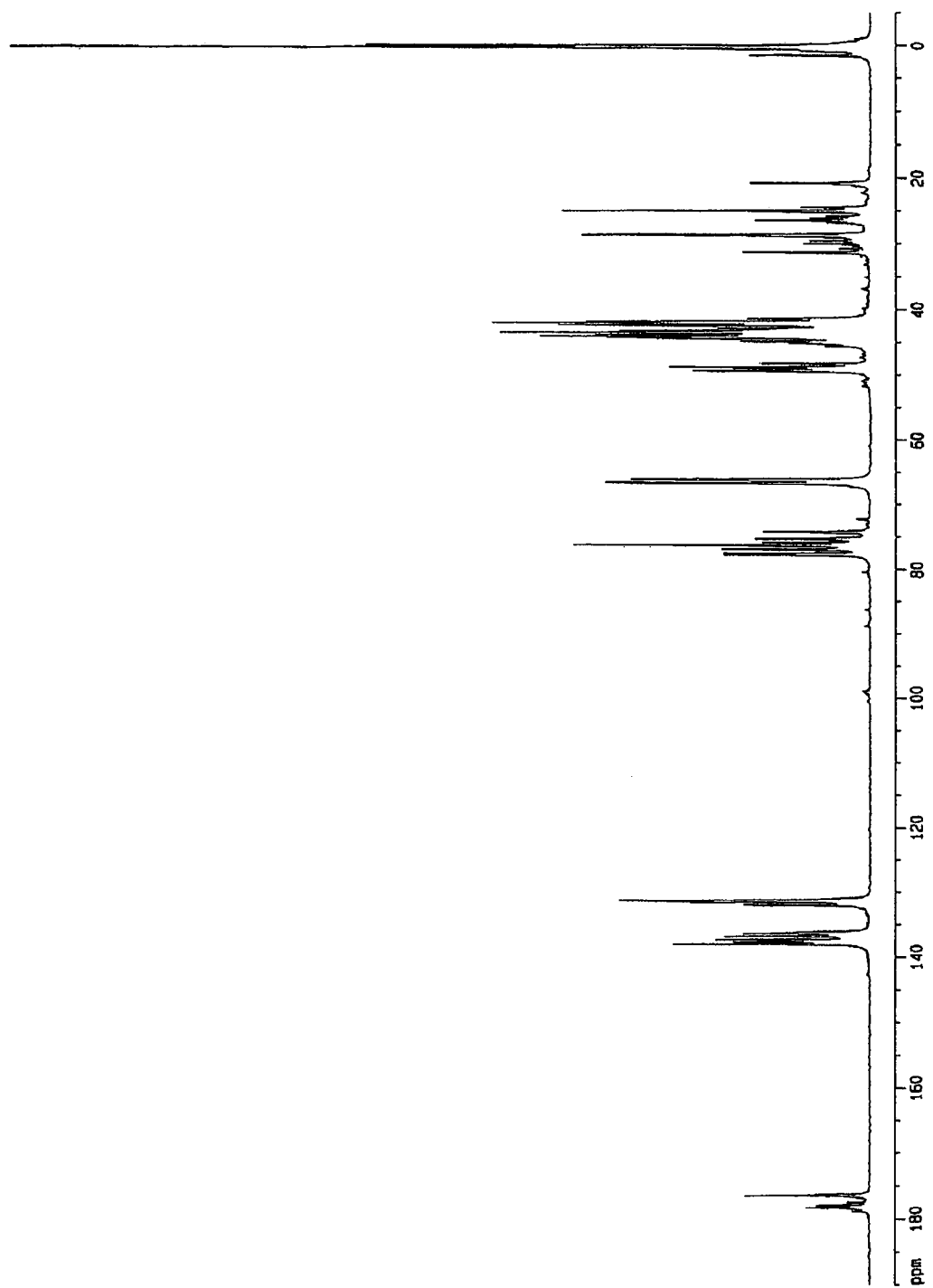
FIG. 4 is a characterization of the product of Example 3 using NMR $^{13}$C (50 MHz in $CDCl_3$).

Synthesis of TMS protected hydroxyl containing lactone norbornene (TMSO-Lac-NB) monomer: In a 250 mL 3-neck flask equipped with a magnetic stirrer and thermometer, butyrolactone (5.0 g, 57.5 mmol) in 60 mL of anhydrous terahydrofuran at −60 C was treated with 29 mL of LDA (2M in THF). The addition speed of LDA was controlled in order for a reaction temperature lower than −55 C. After added with LDA, the reaction mixture was stirred for 5 min at −55 C. Then it was cooled to −70 C. The dry ice/acetone bath was removed allowing the mixture to warm to −60 C to which 5-norbornene-2-carboxaldehyde (7.0 g, 57.5 mmol) was added via syringe. The reaction mixture was slowly warmed to −55 C and recooled to −70 C by merging the flask into a dry ice/acetone bath. After slowly warmed to −55 C, the reaction mixture was recooled to −60 C and trimethylsilyl chloride (6.6 g, 63.3 mmol) was syringed in. The dry ice bath was removed allowing the reaction temperature to rise to ambient while the reaction was stirred overnight. The reaction was worked up by pouring into water (100 mL). The organic was diluted with 50 mL of ethyl ether and 100 mL of ethyl acetate. After the removal of solvent, the crude product was purified chromatographically on silica gel column using cyclohexane/ethyl acetate (9/1) as eluent. Light yellowish oil was collected in a yield of 10.73 g. The product is characterized via mass spectroscopy FI-MS m/e 280, and $^1$H NMR (500 MHz in CDCl$_3$) (see, FIG. 3) and NMR $^{13}$C (50 MHz, in CDCl$_3$) (see, FIG. 4).

EXAMPLE 4

Synthesis of Allyl Sultone

Under nitrogen atmosphere, 1,4-butane sultone (129.4 g, 0.95 mol) was dissolved in anhydrous tetrahydrofuran (1500 ml) in a 500 ml three-necked flask containing a mechanical stir bar. The solution was cooled to −78° C. in a dry ice acetone bath. Under nitrogen, n-butyllithium in pentane (100 ml, 10M) was slowly added over a 30 minute time period wherein some precipitate formed. After stirring for five minutes at −78° C., allylbromide (114.9 g, 0.95 mol) was added over one hour. The obtained clear colorless solution was stirred at −78° C. for two hours. The reaction mixture was poured into a separatory funnel containing ethyl acetate (500 ml), and shaken. The organic phase was separated, washed with brine, dried over magnesium sulfate and evaporated to remove solvent. 80 g (48% yield) of a colorless liquid was obtained. $^1$H NMR and $^{12}$C NMR confirmed the presence of the allyl sultone conforming to the structure:

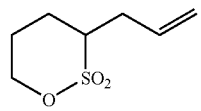

EXAMPLE 5

Synthesis of NB-CH$_2$-Sultone

Allyl sultone (80 g, 0.45 mol.) as synthesized in part a) was mixed with dicyclopentadiene (15 g, 0.114 mol.) and charged into a high pressure reactor. The mixture was heated at 180° C. for 6 hours. After this the reactor was cooled and the reaction mixture was drained. The crude material was purified by distillation under vacuum. About 22 g of pure product was obtained. The purity of the monomer was confirmed by gas chromatography and $^1$H NMR analysis confirmed the structure.

EXAMPLE 6

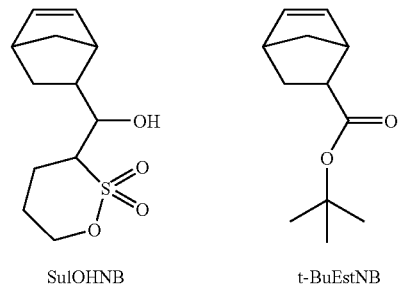

SulOHNB          t-BuEstNB

Synthesis of copolymer of tert-butyl 5-norbornene-2-carboxylate (t-BuEstNB)/SulOHNB: In a 100 ml crimped vial, t-BuEstNB (3.4 g, 17.5 mmol) and SulOHNB (1.94 g, 7.5 mmol) were dissolved in anhydrous toluene (40 mL). The monomer solution was then sparged with nitrogen gas for 30 minutes. A nickel catalyst solution was prepared in a dry-box by dissolving of (ç$^6$-toluene)Ni(C$_6$F$_5$)$_2$ catalyst (0.25 g, 0.5 mmol) in 10 ml of dry toluene. The catalyst solution was added to the monomer via a dry syringe. The reaction mixture was then stirred overnight. The polymer was precipitated into hexane and filtered. It yielded 3.5 g of white powder. The polymer was characterized with $^{13}$C NMR (173.4, (C=O); 79.24, (tertiary C of t-butyl ester); 62-78 (br),m, (3C—alcohol, and C next to sultone), 43.7 (br), 28.52 s, t-butyl groups). GPC in THF using polystyrene as standard showed Mn=12460, Mw=18100.

EXAMPLE 7

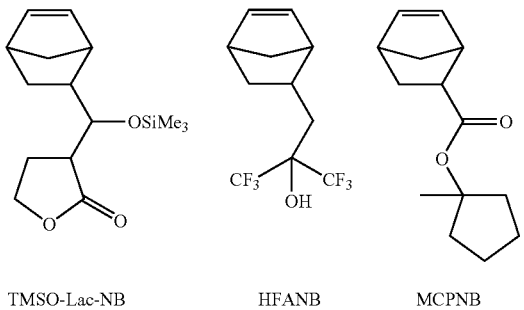

TMSO-Lac-NB     HFANB     MCPNB

Synthesis of terpolymer of TMSO-Lac-NB, 5-norbornene-2-methylhexafluoro-isopropanol (HFANB), and methylcyclopentyl-5-norbornene-2-carboxylate, MCPNB: In a 100 ml crimped vial, TMSO-Lac-NB (2.80 g, 0.01 mol), HFANB (2.74 g, 0.01 mol), and MCPNB (2.90 g, 0.133 mol) were dissolved in 27.0 g of anhydrous toluene. The solution was then sparged with $N_2$ for 40 minutes and syringed in a solution of ($\varsigma^6$-toluene)Ni$(C_6F_5)_2$ (0.64 g, 0.0013 mol) in 13 g of toluene. The polymerization mixture was stirred at room temperature overnight. The polymer was precipitated into hexane and filtered. The polymer was redissolved in 5 toluene/THF (50 mL/20 mL), and treated with per-acetic acid (AcOH/$H_2O_2$/$H_2O$=15 mL/10 mL/10 mL) at 75C for 2.5 h. In a separation funnel the organic phase was separated from aqueous phase washed with plenty of water to neutral. The polymer was again precipitated into hexanes, filtered, dried in vacuum at 80 C overnight. Yield 8.9 g of white polymer. The polymer was characterized by $^1$H NMR (500 MHz, in $CDCl_3$), 4.20, 2.50-1.00, 0.15 (—SiMe$_3$). GPC in THF using polystyrene as standard showed Mn=7700, Mw=16900.

EXAMPLE 8

The polymer formed in Example 7 was dissolved in propylene glycolmethylether acetate (PGMEA) at a concentration of 25% by weight polymer. Thin films of the polymer were spun on 4-inch silicon wafers to test for etch resistance and photolithography performance.

The tests for etch resistance were conducted in a Plasma Therm reactive ion etching (RIE) unit operating at 150 W and 50 mTorr using a $CHF_3$/$O_2$ etchant. The gas flow rates were 22.5 standard cubic centimeters per minute (sccm) for the $CHF_3$, and 2.5 sccm for the $O_2$. The etch resistance for the polymer from Example 5, as well as for samples of Novolac and $SiO_2$ were as follows:

| Sample | Etch Rate (Angstroms/min) | Etch vs. Novolac |
| --- | --- | --- |
| Novolac | 447.17 | 1 |
| SiO$_2$ | 104.89 | 0.23 |
| Example 7 Polymer | 604.91 | 1.35 |

In the tests for photolithography performance the polymer formed in Example 5 was formulated in a 23% by weight photoactive coating composition in which 1% by weight of a photoacid generator (triphenylsulfonium perfluoro-1-butanesulfonate) was added. The coating was spin coated onto 4-inch silicon wafers to test for litho contrast and imagability.

To develop a contrast curve, the coated wafer was exposed to light of 248 nm from 0.0 to 20.0 mJ/cm$^2$ using increments of 0.5 mJ/cm$^2$ per site and developed in 0.26 N tetramethylammonium hydroxide (TMAH). Contrast was reported as γ, a measure of the slope of the contrast defined as 1/Log($D_0$/$D_1$), where D1 is the dose to initiate dissolution and D2 is the dose to clear. The lithography contrast for the polymer from Example 5 is indicated below.

| Sample | Contrast | Dose to Clear (mJ/cm$^2$) |
| --- | --- | --- |
| Example 7 Polymer | 7.44 | 4.7 |

Figure 2:
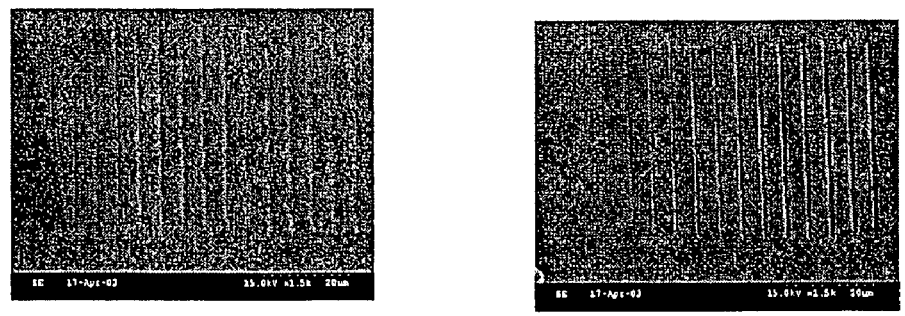
FIG. 2 shows patterns of 1 micron (width) lines obtained using electron beam lithography in Example 8.

To test imagability, the thin coating films spun onto silicon wafers was imaged by shining a masked 248 nm source or by writing with electron-bean. The imaged films are then developed in 0.26 N TMAH aqueous developer. A pattern of 100 micron (width) line was obtained from 248 nm lithography. This is shown in FIG. 1. A pattern of 1 micron (width) line was obtained from electron beam lithography. This is shown in FIG. 2(*a*) which shows 10 μC/cm$^2$ steps and FIG. 2(*b*) which shows 5/μC/cm$^2$ steps.

EXAMPLE 9

Copolymerization of NB-CH$_2$-Sultone and NB-MCP

To a glass vial containing a stir bar under argon was placed 2.42 g of NB-CH$_2$-Sultone and 2.20 g of NB-MCP in a 30 wt. % toluene solution. A nickel catalyst solution was prepared in a dry-box by dissolving 0.196 g of (toluene)Ni $(C_6F_5)_2$ catalyst in 0.8 g of dry toluene. The catalyst solution was added to the monomer via a dry syringe, followed by the addition of 10 g of toluene. The monomer to nickel ratio was 50:1. The reaction mixture was stirred at room temperature for three hours where a dark brown and viscous polymer product was obtained. To the obtained product was added 100 ml of ethyl to dissolve the product. 20 ml of Amberlite® IRC-718 ion exchange resin was added to the solution and stirred overnight at room temperature. The polymer solution was filtered through a 0.22 micron Teflon® filter where a colorless filtrate was obtained. The polymer filtrate solution was concentrated by removing solvent and poured into methanol to precipitate the polymer. A white precipitate formed. The precipitate was placed in a vacuum oven at 70° C. and dried overnight to afford 4.08 g of white polymer powder. $^1$H NMR analysis confirmed the presence of a copolymer having repeating units conforming to structures below:

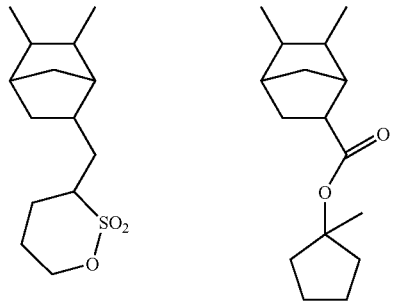

While the invention has been explained in relation to various embodiments, it is to be understood that various modifications thereof will become apparent to those skilled in the art upon reading the specification. Therefore, it is to be understood that the invention disclosed herein is intended to cover such modifications as fall within the scope of the appended claims. The various monomers disclosed herein may be combined in a variety of ways to provide other polymers in addition to those exemplified above.

What is claimed is:

1. A polymer comprising a repeating unit represented by the formula:

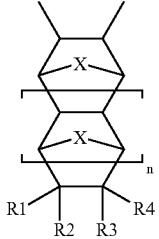

(I-a)

wherein in Formula (I-a):
X is —CH$_2$—, —CH$_2$CH$_2$—, O or S;
n is an integer from 0 to 5 inclusive;
each R1 to R4 independently represents hydrogen, a linear or branched (C$_1$ to C$_{20}$) alkyl, or a linear or branched (C$_1$ to C$_{20}$) haloalkyl, subject to the proviso that at least one of R1 to R4 is a group represented by the formula:

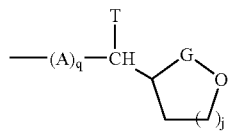

wherein: G is —(O)—; T is H;
j is 1 to 4; q is 0 or 1; and A is a spacer moiety represented by —(CH$_2$)$_m$—, —(CH$_2$)$_m$O—, —(CH$_2$)$_m$O(CH$_2$)$_m$—, O(CH$_2$)$_m$—, —(CH$_2$)$_m$NR$^9$(CH$_2$)$_m$—, —(C(R$^{10}$)$_2$)$_m$(C(R$^{10}$)$_2$)$_m$O(C(R$^{11}$)$_2$)$_a$,

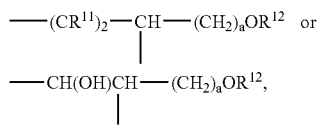

wherein: each R$^9$ independently is (C$_1$ to C$_5$) alkyl; each R$^{10}$ independently is hydrogen, halogen, (C$_1$ to C$_5$) alkyl, or (C$_1$ to C$_5$) haloalkyl; R$^{11}$ independently is hydrogen or halogen; each R$^{12}$ independently is hydrogen, (C$_1$ to C$_{10}$) alkyl or (C$_1$ to C$_5$) haloalkyl; each a independently is a 2 to 6; and each m independently is 0 to 4.

2. The polymer of claim 1 wherein n is q is 0 and j is 1.

3. The polymer of claim 2 wherein X is —CH$_2$—, and R1, R2 and R3 are each hydrogen.

4. The polymer of claim 1 wherein n is 0, q is 0 and j is 2.

5. The polymer of claim 4 wherein X is —CH$_2$—, and R1, R2 and R3 are each hydrogen.

6. A polymer comprising a repeating unit represented by the formula

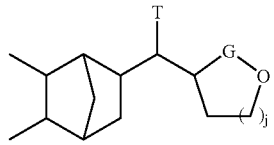

wherein: G is —C(O)—; T is H; and j is 1 or 2.

7. The polymer of claim 1 further comprising a repeating unit represented by the following formula (II-a):

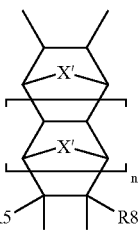

(II-a)

wherein in Formula (II-a):
X' is —CH$_2$—, —CH$_2$CH$_2$—, O or S;
n' is an integer from 0 to 5 inclusive; and
each R5 to R8 independently is selected from: hydrogen; linear or branched (C$_1$ to C$_{20}$) alkyl; linear or branched (C$_1$ to C$_{20}$) haloalkyl; substituted or unsubstituted (C$_4$-C$_{12}$) cycloalkyl; substituted or unsubstituted (C$_1$ to C$_{10}$) hydroxyalkyl; —(CH$_2$)$_b$C(CF$_3$)$_2$OR$^{13}$; —(CH$_2$)$_b$C(O)OR$^{14}$; —(CH$_2$)$_b$OR$^{14}$; —(CH$_2$)$_b$OC(O)R$^{14}$; —(CH$_2$)$_b$C(O)R$^{14}$; —(CH$_2$)$_b$OC(O)OR$^{14}$; —(CH$_2$)$_b$C(O)OR$^{15}$; —(CH$_2$)$_b$Si(R$^{16}$)$_3$; —(CH$_2$)$_b$Si(OR$^{16}$)$_3$; —(CH$_2$)$_b$NR$^{17}$SO$_2$R$^{18}$; or —(CH$_2$)$_b$SO$_2$NR$^{17}$R$^{18}$;
wherein: b is 0 to 4; each R$^{13}$ independently is selected from hydrogen, linear or branched (C$_1$-C$_{10}$) alkyl, or linear or branched (C$_1$-C$_{10}$) haloalkyl; each R$^{14}$ is selected from hydrogen, linear or branched (C$_1$ to C$_{10}$) alkyl, or substituted or unsubstituted (C$_4$-C$_8$) cycloalkyl; R$^{15}$ is an acid labile group; each R$^{16}$ independently is selected from hydrogen and (C$_1$ to C$_5$) alkyl; each R$^{17}$ independently is selected from hydrogen, linear or branched (C$_1$-C$_5$) haloalkyl, linear or branched tri(C$_1$-C$_{10}$) alkylsilyl, —C(O)CF$_3$, —C(O)OR$^{19}$, or —OC(O)OR$^{19}$; each R$^{18}$ independently is selected from hydrogen, linear or branched (C$_1$-C$_{10}$) alkyl, linear or branched (C$_1$-C$_5$) haloalkyl, —OR$^3$, —C(O)R$^3$, substituted or unsubstituted (C$_3$-C$_8$) cycloalkyl, substituted or unsubstituted cyclic esters containing 2 to 8 carbon atoms, substituted or unsubstituted cyclic ketones containing 4 to 8 carbon atoms, substituted or unsubstituted cyclic ethers or cyclic diethers containing 4 to 8 carbon atoms; each R$^{19}$ independently is selected from linear or branched (C$_1$-C$_{10}$) alkyl, or linear or branched (C$_1$-C$_{10}$) haloalkyl; R5 and R6 and/or R7 and R8 independently taken together can form a (C$_1$-C$_5$) alkylidenyl group or a spiral anhydride group; R6 and R7 taken together with the two ring carbon atoms to which they are attached can form a cyclic (C$_3$ to C$_6$) anhydride group, a cyclic (C$_3$ to C$_6$) sulfonamide group, or a cyclic (C$_3$ to C$_6$) sultone group.

8. The polymer of claim 7 wherein X' is —CH$_2$—, n' is 0, each of R5, R6 and R7 is H, and R8 is —(CH$_2$)$_b$C(O)OR$^{14}$, wherein b is 0 and R$^{14}$ is t-butyl.

9. The polymer of claim 8 wherein X is —CH$_2$—, n is 0, each of R1, R2 and R3 is H, q is 0, j is 2.

10. The polymer of claim 7 wherein X' is —CH$_2$—, n' is 0, each of R5, R6 and R7 is H, and R8 is —(CH$_2$)$_b$C(O)OR$^{14}$, wherein b is 0 and R$^{14}$ is 1-methyl cyclopentyl.

11. The polymer of claim 10 wherein X is —CH$_2$—, n is 0, each of R1, R2 and R3 is H, q is 0, j is 1.

12. The polymer of claim 11 wherein the polymer further comprises another repeating unit, the another repeating unit being represented by Formula (II) wherein X' is —CH$_2$—, n' is 0, each of R5, R6 and R7 is H, and R8 is —(CH$_2$)$_b$C(CF$_3$)$_2$OR$^{13}$ wherein b is 1 and R$^{13}$ is hydrogen.

13. A photoresist composition comprising the polymer of claim 1.

14. A photoresist composition comprising the polymer of claim 12.

15. A process for generating an image on a substrate, comprising:
    (a) coating the substrate with a photoresist composition comprising the polymer of claim 1;
    (b) image wise exposing the film to radiation; and
    (c) developing the image.

16. The process of claim 15 wherein the radiation has a wavelength of about 157 nm.

17. The process of claim 15 wherein the radiation has a wavelength of about 193 nm.

18. A process for generating an image on a substrate, comprising:
    (a) coating the substrate with a photoresist composition comprising the polymer of claim 9;
    (b) image wise exposing the film to radiation; and
    (c) developing the image.

19. The process of claim 18 wherein the radiation has a wavelength of about 157 nm.

20. The process of claim 18 wherein the radiation has a wavelength of about 193 nm.

21. A compound represented by the formula:

(I)

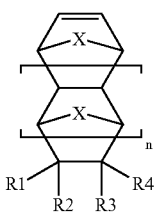

wherein in Formula (I):
X is —CH$_2$—, —CH$_2$CH$_2$—, O or S;
n is an integer from 0 to 5 inclusive;
each R1 to R4 independently represents hydrogen, a linear or branched (C$_1$ to C$_{20}$) alkyl, or a linear or branched (C$_1$ to C$_{20}$) haloalkyl, subject to the proviso that at least one of R1 to R4 is a group represented by the formula:

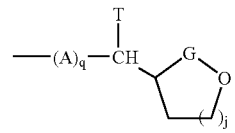

wherein: G is —C(O)—; T is H; j is 1 to 4; q is 0 or 1; and A is a spacer moiety represented by —(CH$_2$)$_m$—, —(CH$_2$)$_m$O—, —(CH$_2$)$_m$O(CH$_2$)$_m$—, O(CH$_2$)$_m$—, —(CH$_2$)$_m$NR$^9$(CH$_2$)$_m$—, —(C(R$^{10}$)$_2$)$_m$(C(R$^{10}$)$_2$)$_m$O(C(R$^{11}$)$_2$)$_a$—,

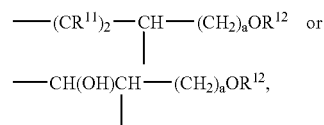

wherein: each R$^9$ independently is (C$_1$ to C$_5$) alkyl; each R$^{10}$ independently is hydrogen, halogen, (C$_1$ to C$_5$) alkyl, or (C$_1$ to C$_5$) haloalkyl; each R$^{11}$ independently is hydrogen or halogen; each R$^{12}$ independently is hydrogen, (C$_1$ to C$_{10}$) alkyl or (C$_1$ to C$_5$) haloalkyl; each a independently is 2 to 6; and each m independently is 0 to 4.

22. The compound of claim 21 wherein n is 0, q is 0 and j is 1.

23. The compound of claim 22 wherein X is —CH$_2$—, and R1, R2 and R3 are each hydrogen.

24. The compound of claim 21 wherein n is 0, q is 0, and j is 2.

25. The compound of claim 24 wherein X is —CH$_2$—, and R1, R2 and R3 are each hydrogen.

26. A compound represented by the formula

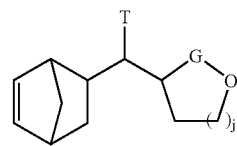

wherein G is —C(O)—, T is H, and j is 1 or 2.

* * * * *